US006345371B1

(12) United States Patent
Lam

(10) Patent No.: US 6,345,371 B1
(45) Date of Patent: Feb. 5, 2002

(54) METHOD OF PERFORMING DIAGNOSTIC PROCEDURES ON A QUEUE STRUCTURE

(75) Inventor: Ian Lam, Fremont, CA (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 0 days.

(21) Appl. No.: 09/304,958

(22) Filed: May 5, 1999

(51) Int. Cl.[7] .................. G11C 29/00; G01R 31/28; G06F 11/00; G06F 11/10
(52) U.S. Cl. .................. 714/719; 714/735; 714/824
(58) Field of Search .................. 714/718, 719, 714/824, 735, 712

(56) References Cited

U.S. PATENT DOCUMENTS

| | | | | |
|---|---|---|---|---|
| 5,497,459 A | * | 3/1996 | Tanihira et al. | 714/30 |
| 5,515,376 A | | 5/1996 | Murthy et al. | |
| 5,649,092 A | * | 7/1997 | Price et al. | 714/15 |
| 5,968,190 A | * | 10/1999 | Knaack | 714/719 |
| 5,978,935 A | * | 11/1999 | Kim et al. | 714/42 |
| 6,108,802 A | * | 8/2000 | Kim et al. | 714/718 |

OTHER PUBLICATIONS

S. Barbagallo, M. L. Bodoni, D. Medina, G. De Blasio, M. Ferloni, F. Fummi, D. Sciuto, "A parametric design of a built–in self–test FIFO embedded memory", This paper appears in: Proceedings 1996 IEEE International Symposium on Defect and Fault Tolerance in.*
A. J. van de Goor, I. Schanstra, Y. Zorian, "Functional test for shifting–type FIFOs" This paper appears in: Proceedings 1995 European Design and Test Conference, On pp.: 133–138, Mar. 6–9, 1995.*
A. J. van de Goor, I. Schanstra, Y., "Fault models and tests for Ring Address Type FIFOs", This paper appears in: Proceedings 12th IEEE VLSI Test Symposium, 1994, On pp.: 300–305, Apr. 25–28, 1994.*
A. J. van de Goor, Y. Zorian, "Fault models and tests specific for FIFO functionality", This paper appears in: Records of the 1993 IEEE International Workshop on Memory Testing, On pp.: 72–76, Aug. 9–10, 1993.*
Mark R. Headington and David D. Riley, "Data Abstraction and Structures Using C++", D. C. Health and Company 1994.*

* cited by examiner

Primary Examiner—Albert Decady
Assistant Examiner—Joseph Torres

(57) ABSTRACT

A method and apparatus are disclosed for testing the functionality of a queue structure. An input circuit is provided for inputting data into an input portion of the queue structure, while an output circuit is provided for retrieving data from an output portion of the queue structure. A comparison logic circuit compares the retrieved data with the input data to determine the integrity of the data that was stored in the queue structure and verify that the data from the output portion is identical to the data input to the queue. Various embodiments are disclosed for testing queue structure both in real time and in a test mode.

16 Claims, 7 Drawing Sheets

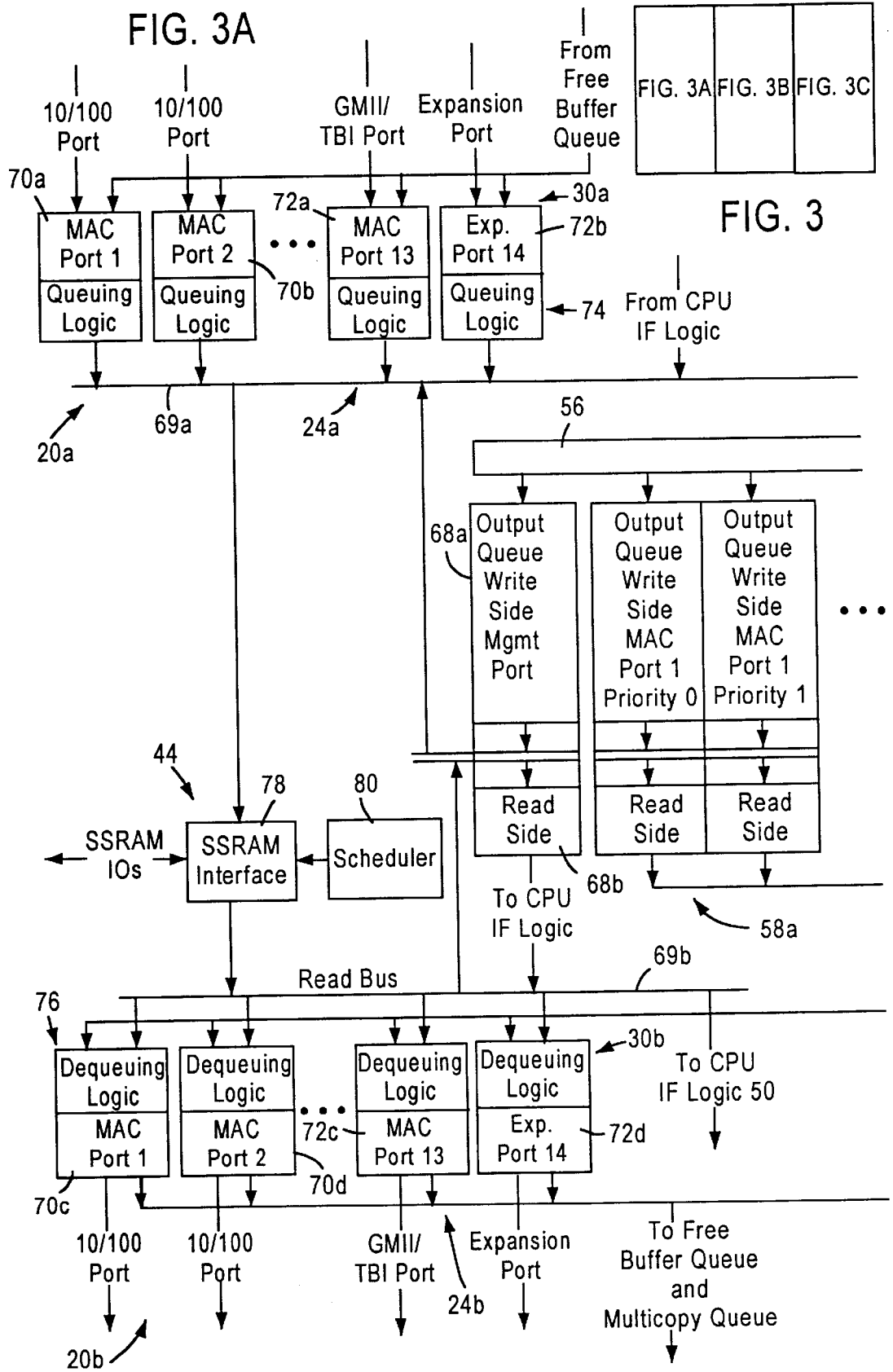

METHOD OF PERFORMING DIAGNOSTIC PROCEDURES ON A QUEUE STRUCTURE

BACKGROUND OF THE INVENTION

1. Field of the Invention

The present invention relates to communication systems, and more particularly, to a method and apparatus for performing diagnostic procedures on queue structures used for storing received data in communication systems.

2. Description of the Related Art

Modern communication systems, such as computer networking systems or communication networks, provide constant transmission of data between end stations and/or intermediate stations such as routers and signal amplifiers. Computer networking systems, such as packet switched networks (e.g., Ethernet networks), often require transmission of data to a single end station or to multiple end stations within the network. The data originates from a user program, and is segmented into multiple data frames and subsequently transmitted in order to simplify processing and minimize the retransmission time required for error recovery. For example, in a conventional e-mail system, a user may desire to send the same e-mail message to four different users that are connected to the e-mail system. Accordingly, the identical data would be directed to multiple end stations.

Packet switched computer networks typically employ a network switch that receives and forwards frame data to individual and/or multiple end stations. The switch makes forwarding decisions upon receipt of frame data based on information contained in a header of the frame data. For example, if a received frame data is to be transmitted to a number of end stations, the switch must make the forwarding decision to forward the frame data to the ports of the correct end stations. Depending on the specific implementation and/or characteristic of the networking system (i.e., data transfer rate, traffic intensity), buffers must be provided for temporary storage of the frame data, received by the switch, until forwarding decisions can be made. The buffers used to store the frame data are often implemented as first in, first out (FIFO) queues.

One concern in systems that implement FIFO queues to store data (frame data or other types of data) is assurance of the integrity of the data from the time they are received and stored in the queue, until they are transmitted out of the queue. This concern is particularly difficult to satisfy if the switch has a number of ports through which information can be transmitted, or operates at a high transfer rate (e.g., 100 Mb/sec or higher). For example, if the frame data is lost or damaged, the end stations will receive inaccurate information, hence requiring retransmission of the lost frame data and increasing traffic intensity.

A design consideration for such systems is to provide a mechanism wherein the structure and reliability of the queue may be periodically tested to ensure integrity of frame data during normal operations. One method of testing the integrity of the queue structure and its function is to provide random access to the data stored therein and verify that the stored data conforms to the original data input to the queue structure. For example, ten entries may be input to the queue structure and randomly accessed for verification purposes.

One difficulty associated with such an approach is the complexity of the logic that must be constructed to implement random access to different entries in the queue structure. Another difficulty associated with such an approach stems from the fact that the queue structure is implemented in a FIFO manner. Consequently, randomly accessing different locations of the queue structure in real time can often result in disruption of the logic used to maintain and access the queue structure. Additionally, once such a disruption occurs, data stored in the queue structure can become disordered, hence eliminating its FIFO nature. In other situations, the data stored in the queue structure may become completely inaccessible, and the switch must be reset.

Accordingly, a primary disadvantage associated with current methods of transmitting data in communication systems, such as a packet switched computer networking system, is the inability to perform diagnostic procedures on buffers used to store data, such as FIFO queue structures, and efficiently determine whether the integrity of received data is maintained within the queue structure.

DISCLOSURE OF THE INVENTION

There is a need for an arrangement for accessing entries in a queue structure of a communication system and detecting whether the data contained in the accessed entry is identical to the data input to the queue structure.

These and other needs are addressed by the present invention, wherein data input to a queue structure is tested in a FIFO manner to ensure the functionality of the queue structure and integrity of the data.

In accordance with one aspect of the invention, a method for testing the functionality of a queue structure comprises the steps: inputting data into an input portion of the queue structure; transferring the data into an output portion of the queue structure; retrieving the data from the output portion of the queue structure; and comparing the retrieved data with the input data to determine the functionality of the queue structure by verifying that the input data has not been altered during the step of transferring. The present arrangement thus determines the functionality of the queue structure by verifying that data input to the queue structure is not corrupted or modified prior to retrieval from the output portion of the queue structure. Because the functionality of the queue structure is determined by accessing the data present at the output portion, the need to randomly access entries within the queue structure and the logic circuitry associated therewith is eliminated.

According to one specific implementation of the present invention, the queue structure may be tested in real time by inputting the retrieved data back into the queue. This allows a designer to test the functionality of the queue structure without the need to shut down or suspend operation of the system. According to another implementation of the present invention, the circuitry normally used to retrieve data may be disabled, while a diagnostic register is enabled to retrieve data from the queue structure. This provides the designer with the flexibility to test a prescribed number of entries and terminate the test whenever desired.

In accordance with another aspect of the present invention, an apparatus for testing the functionality of a queue structure comprises: an input circuit for inputting data into an input portion of the queue structure; a data transfer circuit for transferring data from the input portion to an output portion of the queue structure; an output circuit for retrieving data from the output portion of the queue structure; and a comparison logic circuit for comparing the retrieved data with the input data to determine the integrity thereof by verifying that the input data has not been altered by the data transfer circuit. The present apparatus provides a simplified arrangement for testing the functionality of the queue structure by accessing the data present at the output portion of the queue structure, hence eliminating the need to randomly access entries within the queue structure and the logic circuitry necessary to implement such random access.

Additional advantages and novel features of the present invention will be set forth in part in the description which follows, and in part will become apparent to those skilled in the art upon examination of the following, or may be learned by practice of the invention. The advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATIVE EMBODIMENTS

The present invention will be described with the example of a switch in a packet switched network, such as an Ethernet (IEEE 802.3) network. It will become apparent, however, that the present invention is also applicable to other packet switched systems, as described in detail below, as well as to other types of systems in general.

Switch Architecture Overview

Figure 1:
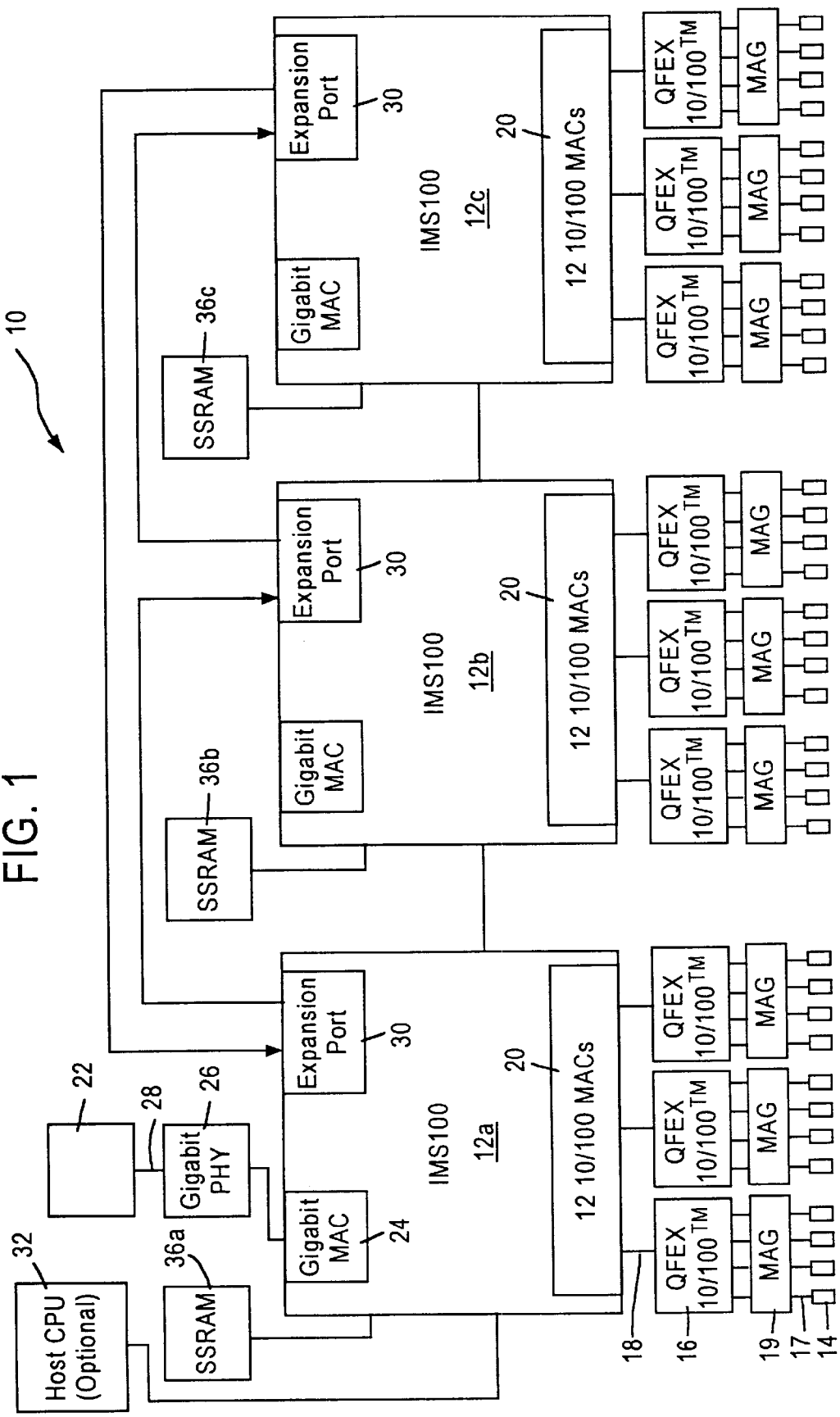
FIG. 1 is a block diagram of a packet switched network including a multiple port switch according to an embodiment of the present invention.

FIG. 1 is a block diagram of an exemplary system in which the present invention may be advantageously employed. The exemplary system 10 is a packet switched network, such as an Ethernet (IEEE 802.3) network. The packet switched network includes integrated multiport switches (IMS) 12 that enable communication of data packets between network stations. The network may include network stations having different configurations, for example twelve (12) 10 megabit per second (Mb/s) or 100 Mb/s network stations 14 (hereinafter 10/100 Mb/s) that send and receive data at a network data rate of 10 Mb/s or 100 Mb/s, and a 1000 Mb/s (i.e., 1 Gb/s) network node 22 that sends and receives data packets at a network speed of 1 Gb/s. The gigabit node 22 may be a server, or a gateway to a high-speed backbone network. Hence, the multiport switches 12 selectively forward data packets received from the network nodes 14 or 22 to the appropriate destination based upon Ethernet protocol.

Each multiport switch 12 includes a media access control (MAC) module 20 that transmits and receives data packets to and from 10/100 Mb/s physical layer (PHY) transceivers 16 via respective reduced media independent interfaces (RMII) 18 according to IEEE 802.3u protocol. Each multiport switch 12 also includes a gigabit MAC 24 for sending and receiving data packets to and from a gigabit PHY 26 for transmission to the gigabit node 22 via a high speed network medium 28.

Each 10/100 1 Mb/s network station 14 sends and receives data packets to and from the corresponding multiport switch 12 via a media 17 and according to either half-duplex or full duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished over the medium 17. Rather, each half-duplex station 14 includes an Ethernet interface card that uses carrier-sense multiple access with collision detection (CSMA/CD) to listen for traffic on the media. The absence of network traffic is detected by sensing deassertion of a receive carrier on the media. Any station 14 having data to send will attempt to access the channel by waiting a predetermined time, known as the interpacket gap interval (IPG), after deassertion of the receive carrier on the media. If a plurality of stations 14 have data to send on the network, each of the stations will attempt to transmit in response to the sensed deassertion of the receive carrier on the media and after the IPG interval, possibly resulting in a collision. Hence, the transmitting station will monitor the media to determine if there has been a collision due to another station sending data at the same time. If a collision is detected, both stations stop, wait a random amount of time, and retry transmission.

The 10/100 Mb/s network stations 14 that operate in full duplex mode send and receive data packets according to the Ethernet standard IEEE 802.3u. The full-duplex environment provides a twoway, point-to-point communication link enabling simultaneous transmission and reception of data packets between each link partner, i.e., the 10/100 Mb/s network station 14 and the corresponding multiport switch 12.

Each multiport switch 12 is coupled to 10/100 physical layer (PHY) transceivers 16 configured for sending and receiving data packets to and from the corresponding multiport switch 12 across a corresponding reduced media independent interface (RMII) 18. In particular, each 10/100 PHY transceiver 16 is configured for sending and receiving data packets between the multiport switch 12 and up to four (4) network stations 14 via the RMHII 18. A magnetic transformer 19 provides AC coupling between the PHY transceiver 16 and the corresponding network medium 17. Hence, the RMII 18 operates at a data rate sufficient to enable simultaneous transmission and reception of data packets by each of the network stations 14 to the corresponding PHY transceiver 16.

Each multiport switch 12 also includes an expansion port 30 for transferring data between other switches according to a prescribed protocol. Each expansion port 30 enables multiple multiport switches 12 to be cascaded together as a separate backbone network.

Figure 2:
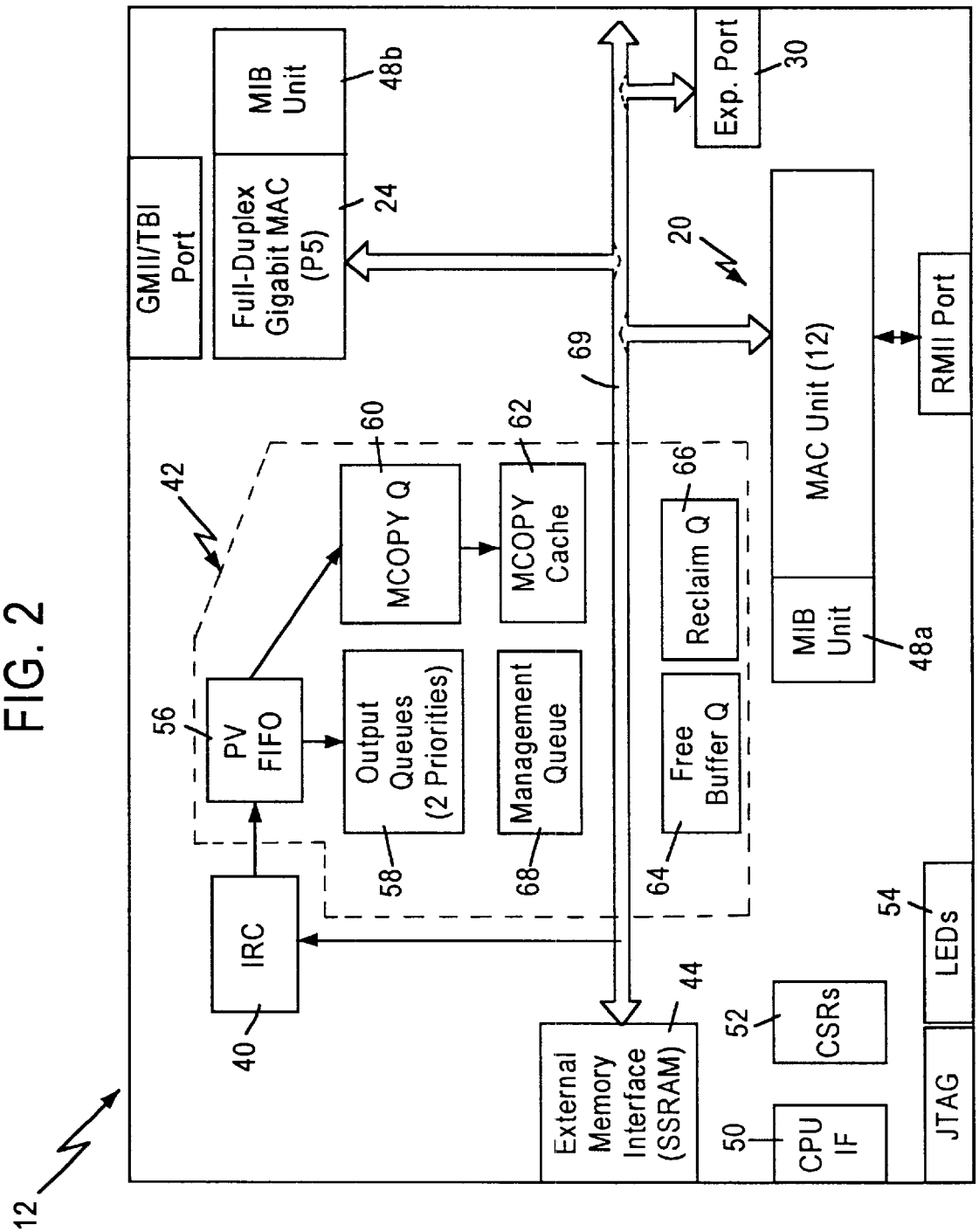
FIG. 2 is a block diagram of the multiple port switch of FIG. 1.

FIG. 2 is a block diagram of the multiport switch 12. The multiport switch 12 contains a decision making engine 40 that performs frame forwarding decisions, a switching subsystem 42 for transferring frame data according to the frame forwarding decisions, an external memory interface 44, management information base (MIB) counters 48a and 48b (collectively 48), and MAC (media access control) protocol interfaces 20 and 24 to support the routing of data packets between the Ethernet (IEEE 802.3) ports serving the network stations 14 and the gigabit node 22. The MIB counters 48 provide statistical network information in the form of management information base (MIB) objects, to an external management entity controlled by a host CPU 32, described below.

The external memory interface 44 enables external storage of packet data in an external memory 36 such as, for example, a synchronous static random access memory (SSRAM), in order to minimize the chip size of the multiport switch 12. In particular, the multiport switch 12 uses the external memory 36 for storage of received frame data and memory structures. The external memory 36 is preferably either a Joint Electron Device Engineering Council (JEDEC) pipelined burst or Zero Bus Turnaround™ (ZBT)-SSRAM having a 64-bit wide data path and a 17-bit wide address path. The external memory 36 is addressable as upper and lower banks of 128K in 64-bit words. The size of the external memory 36 is preferably at least 1 Mbytes, with data transfers possible on every clock cycle through pipelining. Additionally the external memory interface clock operates at clock frequencies of at least 66 MHz, and, preferably, 100 MHz and above.

The multiport switch 12 also includes a processing interface 50 that enables an external management entity such as a host CPU 32 to control overall operations of the multiport switch 12. In particular, the processing interface 50 decodes CPU accesses within a prescribed register access space, and reads and writes configuration and status values to and from configuration and status registers 52.

The internal decision making engine 40, referred to as an internal rules checker (IRC), makes frame forwarding decisions for data packets received.

The multiport switch 12 also includes an LED interface 54 that clocks out the status of conditions per port and drives an external LED logic. The external LED logic drives LED display elements that are human readable.

The switching subsystem 42, configured for implementing the frame forwarding decisions of the IRC 40, includes a port vector first in first out (FIFO) buffer 56, a plurality of output queues 58, a multicopy queue 60, a multicopy cache 62, a free buffer queue 64, and a reclaim queue 66.

The MAC unit 20 includes modules for each port, each module including a MAC receive portion, a receive FIFO buffer, a transmit FIFO buffer, and a MAC transmit portion. Data packets from a network station 14 are received by the corresponding MAC port and stored in the corresponding receive FIFO. The MAC unit 20 obtains a free buffer location (i.e., a frame pointer) from the free buffer queue 64, and outputs the received data packet from the corresponding receive FIFO to the external memory interface 44 for storage in the external memory 36 at the location specified by the frame pointer.

The IRC 40 monitors (i.e., "snoops") the data bus to determine the frame pointer value and the header information of the received packet (including source, destination, and VLAN address information). The IRC 40 uses the header information to determine which MAC ports will output the data frame stored at the location specified by the frame pointer. The decision making engine (i.e., the IRC 40) may thus determine that a given data frame should be output by either a single port, multiple ports, all ports (i.e., broadcast) or no ports (i.e., discarded). For example, each data frame includes a header having source and destination address, where the decision making engine 40 may identify the appropriate output MAC port based upon the destination address. Alternatively, the destination address may correspond to a virtual address that the appropriate decision making engine identifies as corresponding to a plurality of network stations. In addition, the frame may include a VLAN tag header that identifies the frame as information destined to one or more members of a prescribed group of stations. The IRC 40 may also determine that the received data packet should be transferred to another multiport switch 12 via the expansion port 30. Hence, the internal rules checker 40 will decide whether a frame temporarily stored in the external memory 36 should be output to a single MAC port or multiple MAC ports.

The internal rules checker 40 outputs a forwarding decision to the switch subsystem 42 in the form of a forwarding descriptor. The forwarding descriptor includes a priority class identifying whether the frame is high priority or low priority, a port vector identifying each MAC port that should transmit the data frame, receive port number, an untagged set, VLAN information, vector identifying each MAC port that should include VLAN information during transmission, opcode, and frame pointer. The port vector identifies the MAC ports to receive the data frame for transmission (e.g., 10/100 MAC ports 1–12, Gigabit MAC port, and/or Expansion port). The port vector FIFO 56 decodes the forwarding descriptor including the port vector, and supplies the frame pointer to the appropriate output queues 58 that correspond to the output MAC ports to receive the data frame transmission. In other words, the port vector FIFO 56 supplies the frame pointer on a per-port basis. The output queues 58 give the frame pointer to a dequeuing block 76 (shown in FIG. 3) which fetches the data frame identified in the port vector from the external memory 36 via the external memory interface 44, and supply the retrieved data frame to the appropriate transmit FIFO of the identified ports. If a data frame is to be supplied to a management agent, the frame pointer is also supplied to a management queue 68, which can be processed by the host CPU 32 via the CPU interface 50.

The multicopy queue 60 and the multicopy cache 62 keep track of the number of copies of the data frame that are transmitted from the respective ports, ensuring that the data frame is not overwritten in the external memory 36 until the appropriate number of copies of the data frame have been output from the external memory 36. Once the number of copies output corresponds to the number of ports specified in the port vector FIFO 56, the frame pointer is forwarded to the reclaim queue 66. The reclaim queue 66 stores frame pointers that need to be reclaimed and walks the linked list chain to return the buffers to the free buffer queue 64 as free pointers. After being returned to the free buffer queue 64, the frame pointer is available for reuse by the MAC unit 20 or the gigabit MAC unit 24.

Figure 3B:
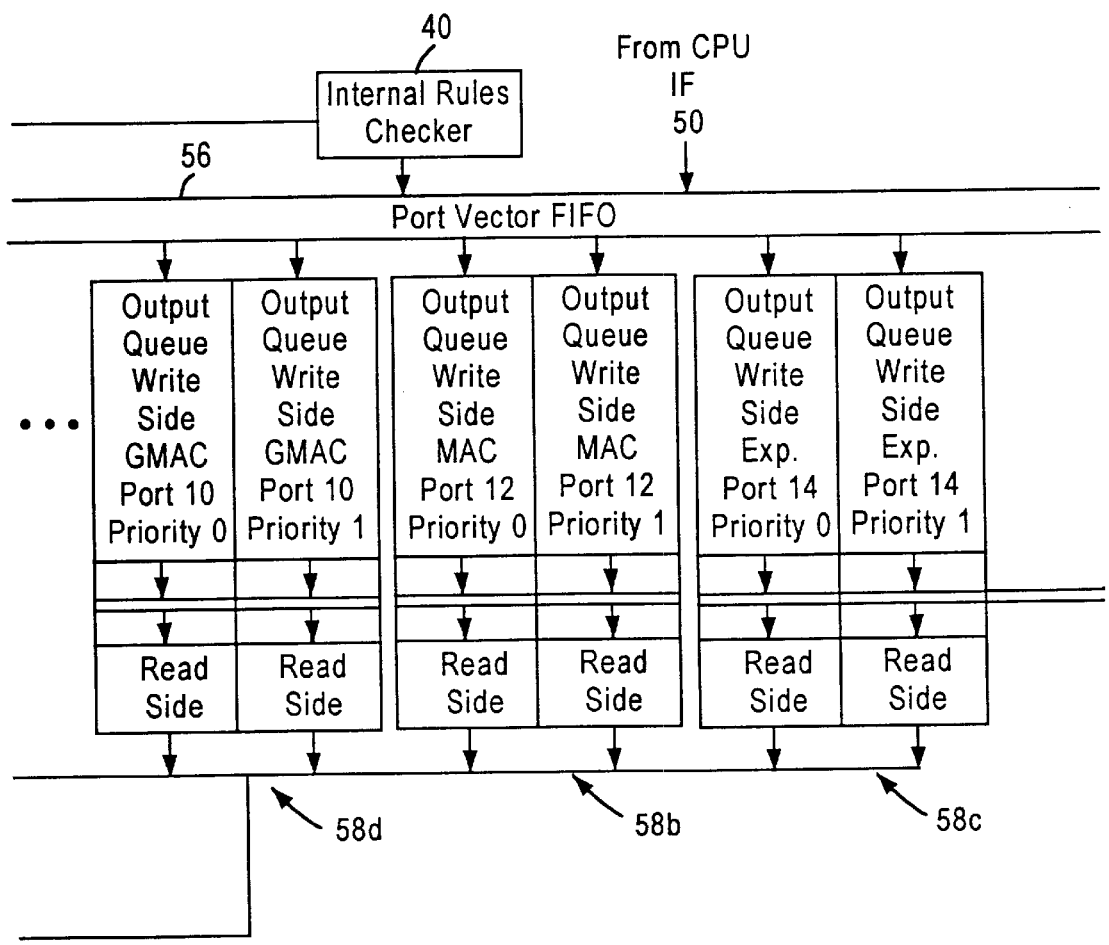
FIG. 3 is a block diagram illustrating in detail the switching subsystem of FIG. 2.
Figure 3C:
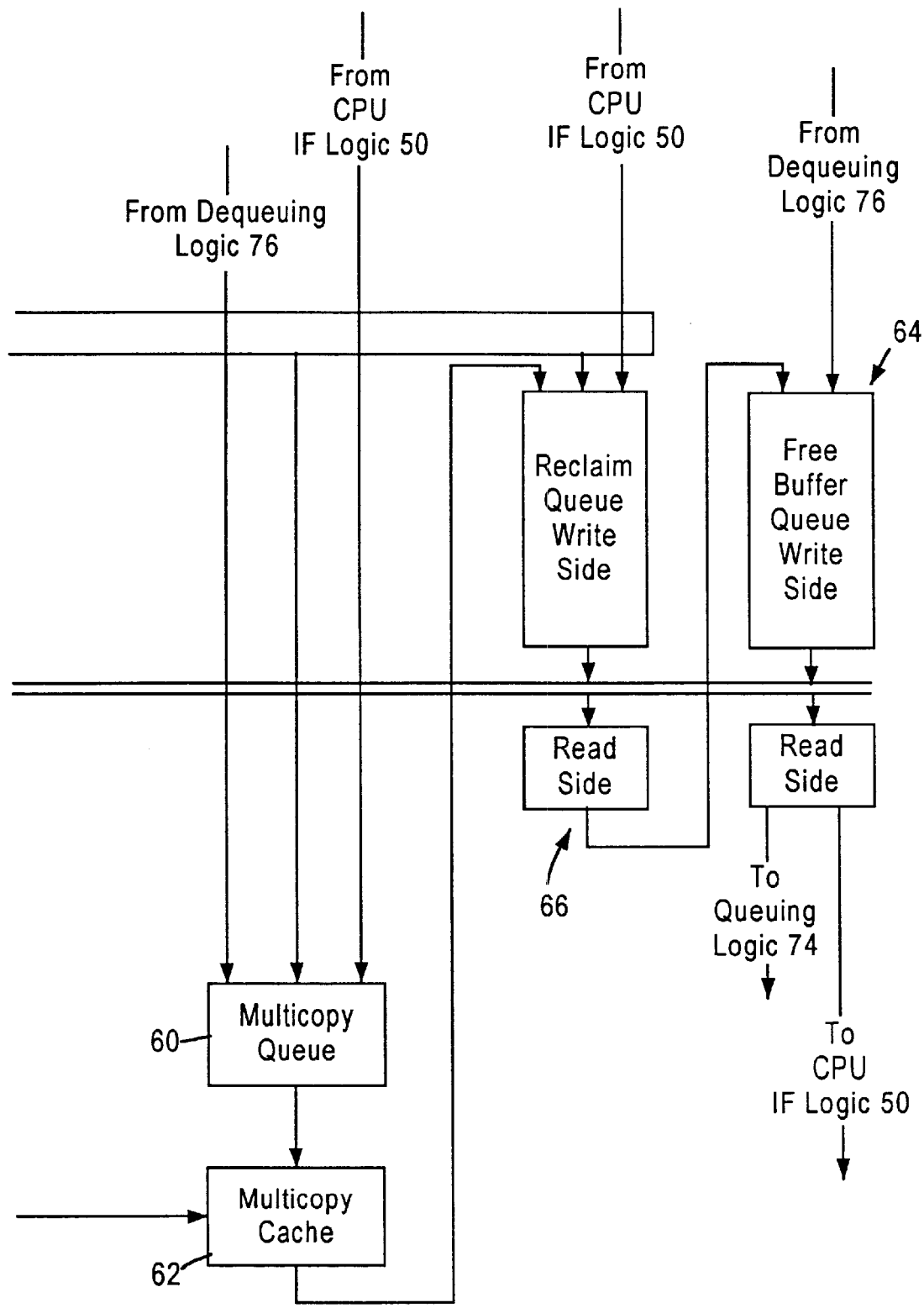

FIG. 3 depicts the switch subsystem 42 of FIG. 2 in more detail according to an exemplary embodiment of the present invention. Other elements of the multiport switch 12 of FIG. 2 are reproduced in FIG. 3 to illustrate the connections of the switch subsystem 42 to these other elements.

As shown in FIG. 3, the MAC module 20 includes a receive portion 20a and a transmit portion 24b. The receive portion 20a and the transmit portion 24b each include 12 MAC modules (only two of each shown and referenced by numerals 70a, 70b, 70c, and 70d) configured for performing the corresponding receive or transmit function according to IEEE 802.3protocol. The MAC modules 70c and 70d perform the transmit MAC operations for the 10/100 Mb/s switch ports complementary to modules 70a and 70b, respectively.

The gigabit MAC port 24 also includes a receive portion 24a and a transmit portion 24b, while the expansion port 30 similarly includes a receive portion 30a and a transmit portion 30b. The gigabit MAC port 24 and the expansion port 30 also have receive MAC modules 72a and 72b optimized for the respective ports. The transmit portions 24b and 30b of the gigabit MAC port 24 and the expansion port 30a also have transmit MAC modules 72c and 72d, respectively. The MAC modules are configured for full-duplex operation on the corresponding port, and the gigabit MAC modules 72a and 72c are configured in accordance with the Gigabit Proposed Standard IEEE Draft P802.3z.

Each of the receive MAC modules 70a, 70b, 72a, and 72b include queuing logic 74 for transfer of received data from the corresponding internal receive FIFO to the external memory 36 and the rules checker 40. Each of the transmit MAC modules 70c, 70d, 72c, and 72d includes a dequeuing logic 76 for transferring data from the external memory 36 to the corresponding internal transmit FIFO, and a queuing logic 74 for fetching frame pointers from the free buffer queue 64. The queuing logic 74 uses the fetched frame pointers to store receive data to the external memory 36 via the external memory interface controller 44. The frame buffer pointer specifies the location in the external memory 36 where the received data frame will be stored by the receive FIFO.

The external memory interface 44 includes a scheduler 80 for controlling memory access by the queuing logic 74 or dequeuing logic 76 of any switch port to the external memory 36, and an SSRAM interface 78 for performing the read and write operations with the external memory 36. In particular, the multiport switch 12 is configured to operate as a non-blocking switch, where network data is received and output from the switch ports at the respective wire rates of 10, 100, or 1000 Mb/s. Hence, the scheduler 80 controls the access by different ports to optimize usage of the bandwidth of the external memory 36.

Each receive MAC stores a portion of a frame in an internal FIFO upon reception from the corresponding switch port; the size of the FIFO is sufficient to store the frame data that arrives between scheduler time slots. The corresponding queuing logic 74 obtains a frame pointer and sends a write request to the external memory interface 44. The scheduler 80 schedules the write request with other write requests from the queuing logic 74 or any read requests from the dequeuing logic 76, and generates a grant for the requesting queuing logic 74 (or the dequeuing logic 76) to initiate a transfer at the scheduled event (i.e., slot). Sixty-four bits of frame data is then transferred over a write data bus 69a from the receive FIFO to the external memory 36 in a direct memory access (DMA) transaction during the assigned slot. The frame data is stored in the location pointed to by the buffer pointer obtained from the free buffer pool 64, although a number of other buffers may be used to store data frames, as will be described.

The rules checker 40 also receives the frame pointer and the header information (including source address, destination address, VLAN tag information, etc.) by monitoring (i.e., snooping) the DMA write transfer on the write data bus 69a. The rules checker 40 uses the header information to make the forwarding decision and generate a forwarding instruction in the form of a forwarding descriptor that includes a port vector. The port vector has a bit set for each output port to which the frame should be forwarded. If the received frame is a unicopy frame, only one bit is set in the port vector generated by the rules checker 40. The single bit that is set in the port vector corresponds to a particular one of the ports.

The rules checker 40 outputs the forwarding descriptor including the port vector and the frame pointer into the port vector FIFO 56. The port vector is examined by the port vector FIFO 56 to determine which particular output queue should receive the associated frame pointer. The port vector FIFO 56 places the frame pointer into the top of the appropriate queue 58 and/or 68. This queues the transmission of the frame.

As shown in FIG. 3, each of the transmit MAC units 70c, 70d, 72d, and 72c has an associated output queue 58a, 58b, 58c, and 58d, respectively. In preferred embodiments, each of the output queues 58 has a high priority queue for high priority frames, and a low priority queue for low priority frames. The high priority frames are used for frames that require a guaranteed access latency, e.g., frames for multimedia applications or management MAC frames. The frame pointers stored in the FIFO-type output queues 58 are processed by the dequeuing logic 76 for the respective transmit MAC units. At some point in time, the frame pointer reaches the bottom of an output queue 58, for example, output queue 58d for the gigabit transmit MAC 72c. The dequeuing logic 76 for the transmit gigabit port 24b takes the frame pointer from the corresponding gigabit port output queue 58d, and issues a request to the scheduler 80 to read the frame data from the external memory 36 at the memory location specified by the frame pointer. The scheduler 80 schedules the request, and issues a grant for the dequeuing logic 76 of the transmit gigabit port 24b to initiate a DMA read. In response to the grant, the dequeuing logic 76 reads the frame data (along the read bus 69b) in a DMA transaction from the location in external memory 36 pointed to by the frame pointer, and stores the frame data in the internal transmit FIFO for transmission by the transmit gigabit MAC 72c. If the forwarding descriptor specifies a unicopy transmission, the frame pointer is returned to the free buffer queue 64 following writing the entire frame data into the transmit FIFO.

A multicopy transmission is similar to the unicopy transmission, except that the port vector has multiple bits set, designating the multiple ports from which the data frame will be transmitted. The frame pointer is placed into each of the appropriate output queues 58 and transmitted by the appropriate transmit MAC units 20b, 24b, and/or 30b.

The free buffer pool 64, the multicopy queue 60, the reclaim queue 66, and the multicopy cache 62 are used to manage use of frame pointers and re-use of frame pointers once the data frame has been transmitted to its designated output port(s). In particular, the dequeuing logic 76 passes frame pointers for unicopy frames to the free buffer queue 64 after the buffer contents have been copied to the appropriate transmit FIFO.

For multicopy frames, the port vector FIFO 56 supplies multiple copies of the same frame pointer to more than one output queue 58, each frame pointer having a unicopy bit set to zero. The port vector FIFO 56 also copies the frame pointer and the copy count to the multicopy queue 60. The multicopy queue 60 writes the copy count to the multicopy cache 62. The multicopy cache 62 is a random access memory having a single copy count for each buffer in external memory 36 (i.e., each frame pointer).

Once the dequeuing logic 76 retrieves the frame data for a particular output port based on a fetched frame pointer and stores the frame data in the transmit FIFO, the dequeuing logic 76 checks if the unicopy bit is set to 1. If the unicopy bit is set to 1, the frame pointer is returned to the free buffer queue 64. If the unicopy bit is set to zero indicating a multicopy frame pointer, the dequeuing logic 76 writes the frame pointer with a copy count of minus one (−1) to the multicopy queue 60. The multicopy queue 60 adds the copy count to the entry stored in the multicopy cache 62.

When the copy count in multicopy cache 62 for the frame pointer reaches zero, the frame pointer is passed to the reclaim queue 66. Since a plurality of frame pointers may be used to store a single data frame in multiple buffer memory locations, the frame pointers are referenced to each other to form a linked-list (i.e., chain) of frame pointers to identify the stored data frame in its entirety. The reclaim queue 66 traverses the chain of buffer locations identified by the frame pointers, and passes the frame pointers to the free buffer queue 64.

The foregoing description of the switch architecture provides an overview of the switch operations in a packet switched network. A more detailed description of the features of the present invention as embodied in the multiport switch 12 will now be provided. First, the architecture of an exemplary output queue will be discussed, followed by the details for performing diagnostic procedures on queue structures of the multiport switch 12.

Queue Structure

Figure 4:
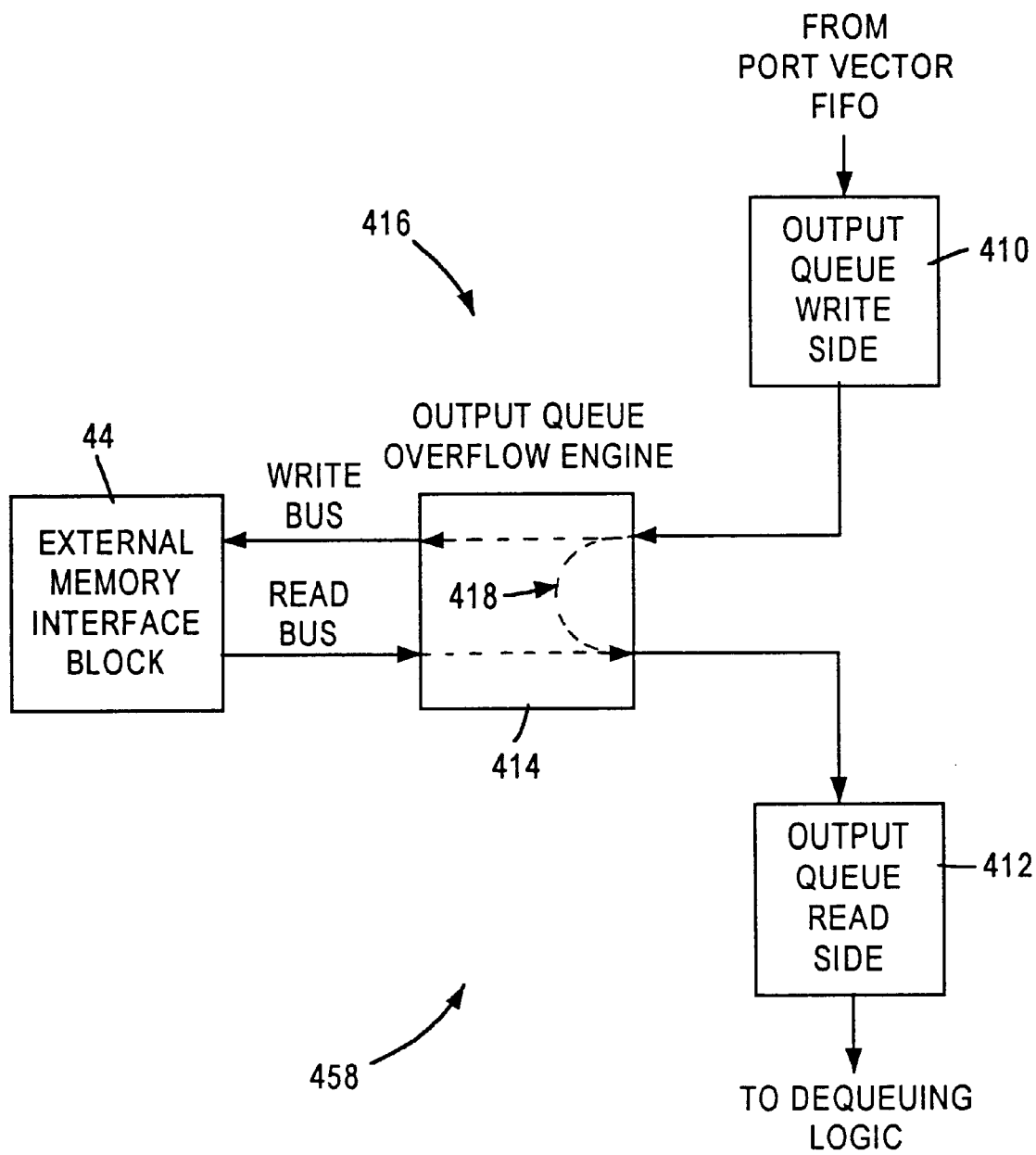
FIG. 4 is a block diagram of a single output queue of the switch subsystem constructed in accordance with an embodiment of the present invention.

FIG. 4 is a block diagram of the external structure of an output queue 458 whose functionality can be tested in accordance with an embodiment of the present invention. As is apparent from FIG. 4, the output queue 458 illustrated has a three-part configuration. For highest performance, it is preferable to keep all of the queuing structure on the chip (referring to the multiport switch 12). The output queue includes a high performance, low capacity section that is on-chip, and an overflow area that is off-chip. The overflow area allows the queue to serve as a large capacity queue as needed, albeit with a relatively lower performance than the on-chip portion.

The output queue 458 illustrated in FIG. 4 has three physical sections. These include an output queue write side 410, an output queue read side 412, and an output queue overflow area 416 which incorporates an output queue overflow engine 414, the external memory interface block 44, and the external memory 36. Access to the external memory 36 for the output queues 458 is through the external memory interface 34, as described earlier. The present invention takes advantage of the bursting nature of current external memories, so that the data (e.g., frame pointers) is sent on and off the chip to the output queue overflow area in bursts over the external memory interface block 44 that connects the network chip 12 to the external memory 36.

The output queue write side 410 and the output queue read side 412 are located on the multiport switch 12. The write side 410 and the read side 412 are considered to be small, expensive resources. By contrast, the overflow area 416, forming the third part of the output queue 458, is large and inexpensive. The write side 410 and the read side 412 provide high performance, while the path through the overflow area provides a low-performance, large capacity path.

In operation, the output queue write side 410 receives an entry. In the exemplary embodiment of a multiport switch 12 according to the present invention, the entry is a frame pointer that points to the first buffer in external memory in which the first 256 bytes of a data frame are stored. It should be apparent to those of skill in the art, however, that the output queue structure 458 is not limited to frame pointers as entries, but is widely applicable to queue other types of entries, both in multiport switches and in other technologies.

After the entry flows through and reaches the bottom of the output queue write side 410, the output queue overflow engine 414 makes a decision as to what to do with the entry. If there is space in the output queue read side 412, and the overflow area 416 for that output queue 458 is empty, then one or more entries are passed directly from the output queue write side 410 to the output queue read side 412 along the path designated by the reference numeral 418. This passing of the entry (or entries) directly from the write side 410 to the read side 412 (referred to as "trickling") is performed entirely on the network chip 12, and is therefore a low-latency, fast flow-through of an entry.

If the output queue read side 412 is full, and there is at least a burst-size amount of data (e.g., 16 bytes worth of entries) in the output queue write side 410, then the data is written in a burst fashion into the overflow area 416 for the output queue 458. If the output queue read side 412 is full, but there is not yet a burst-size amount of data in the output queue write side 410, then the entry remains in the output queue write side and nothing further is done. Eventually, the output queue read side 412 will empty, and when the output queue read side 412 has enough space to accommodate a burst-size amount of data, and there is data in the overflow area 416, a burst of data is provided from the overflow area 416 into the output queue read side 412.

In the output queue structure, the read side 412 is acting most like a traditional queue, because it is from this portion that entries are taken, one by one. The output queue write side 410 mostly serves a collection function to assemble the data into bursts for writing to the external memory 36. Hence, the present invention transforms single events (placing an entry into the output queue 458) into a burst event. The write side 410 allows an accumulation of data to then burst, if necessary, to the overflow area 416 in the external memory 36. The overflow area 416 provides inexpensive storage in times of congestion, rather than dedicating expensive chip resources to a function that will only be needed on relatively rare occasions. Even though the present invention utilizes an overflow area 416 that is off-chip, the accessing of this area is performed in a manner that is efficient, by bursting a number of bytes of information at a time and utilizing high speed (i.e., less than 10 nanosecond) SSRAM. This is in contrast to conventional queuing structures in which single entries are written and read to and from the queue.

During operation, if there are a lot of entries arriving at the output queue 458, these entries are placed into the overflow area 416 to avoid overflowing the read side 412. Hence, the discarding of data frames is largely prevented with the queue structure of the present invention. In addition, the total amount of memory dedicated to the overflow areas 416 may be readily changed by changing the size of the external memory 36. Furthermore, the sizes of the individual specific overflow areas 416 are programmable to customize the queue sizes, without affecting the performance of the output queues 458.

Typically, a queue is an ordered structure with a first-in, first-out arrangement. In some types of queue structures, however, such as the reclaim queue 66 and the free buffer pool 68, the order of entries does not matter. If it is possible to send data directly from the write side 410 to the read side 412, the present invention permits information to be directly sent via this route, hence bypassing the external memory 36. This is permitted even if there is information in the associated overflow area, as long as the information is not order-sensitive. For example, the reclamation of buffers is not order-sensitive, since any order in which the buffers are eventually returned to the free list in the free buffer pool 68 after the buffer is no longer needed to store frame data is acceptable. Hence, in order to avoid incurring the bandwidth of a write to the overflow area for the reclaim queue 66 in the external memory 36 when the data is not order-sensitive, the information is passed directly from the write side 410 to the read side 412, assuming the read side 102 has room for more entries. The reclaim queue 66 is an example of a type of queue that queues data which is not order-sensitive. However, there are many other types of data in different applications that are also not order-sensitive, so that this feature of the present invention finds utility in queues that queue these other types of data.

Testing Queue Structures

Figure 5:
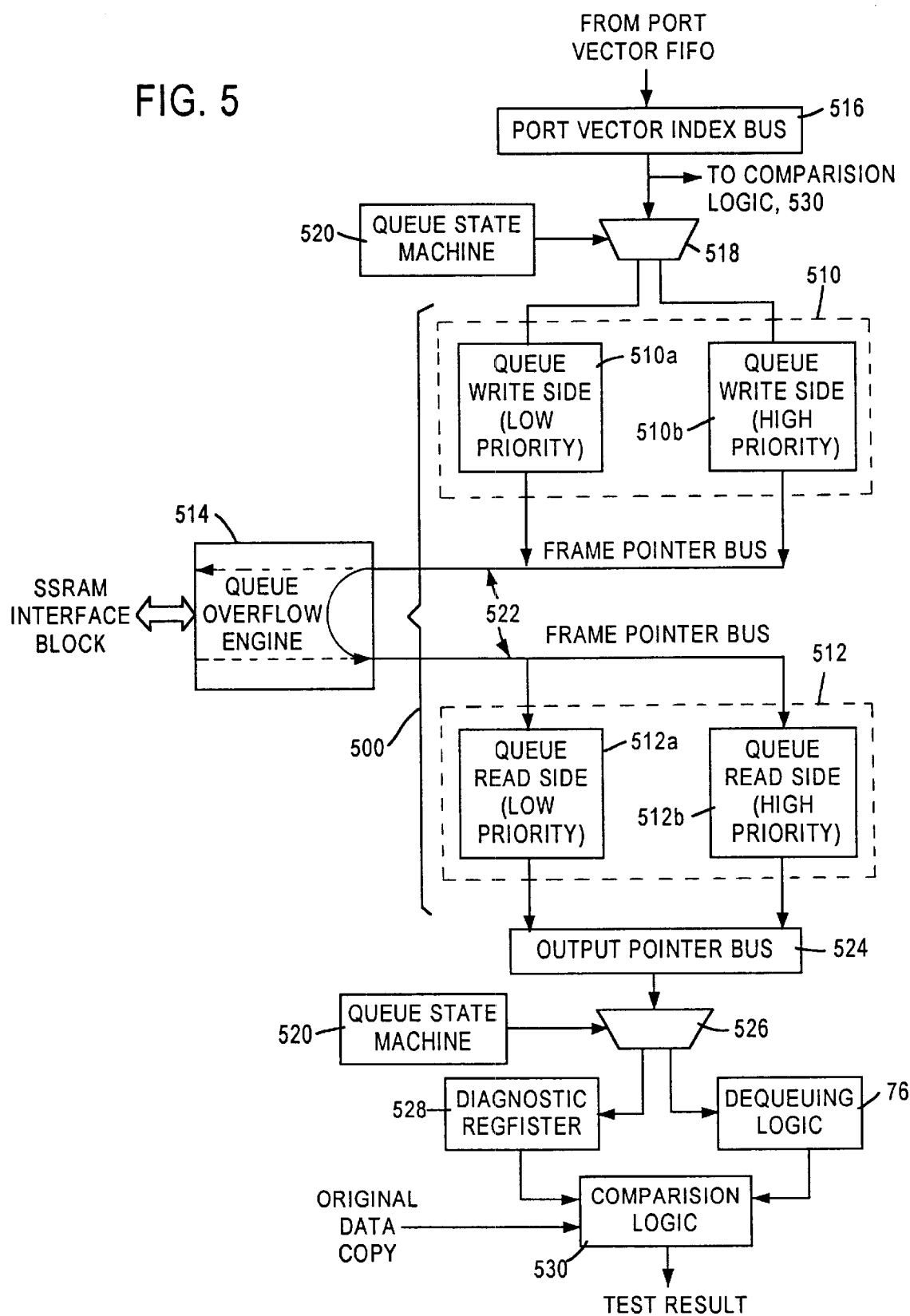
FIG. 5 is a block diagram illustrating an arrangement for performing diagnostic procedures on an output queue in accordance with an embodiment of the present invention.

FIG. 5 illustrates an exemplary arrangement for testing a queue structure 500 according to an embodiment of the present invention. The queue structure 500 illustrated in Figure S incorporates many of the features found in the various types of queues (e.g., reclaim, free buffer, etc.) used in the multiport switch 12. The queue structure 500 includes a queue write side (i.e., write portion) 510 and a queue read side (i.e., read portion) 512. The queue structure 500 may also be provided with an overflow engine 514 that allows data to be written to and retrieved from an external memory 36, such as the external SSRAM.

The queue structure 500 receives data from an external source, such as the port vector FIFO 56, along a port vector index bus 516. As previously stated, the port vector FIFO 56 receives data from two primary sources (the IRC 40 and the processor interface 50), processes the data, and forwards the processed data to various queues (output queues 58, multicopy queue 60, and reclaim queue 66). The data is transferred from the port vector index bus 516 to the queue write side 510. While data is illustrated as being received from the port vector FIFO 56, those skilled in the art will readily recognize that the data may originate from other sources and be transferred along any appropriate data bus. For example, if the queue structure being tested is the free buffer queue 64, then data originates from the MAC dequeuing logic 76, the reclaim queue 66, or the multicopy cacheg 62; if the reclaim queue 66 is being tested, then data originates from the multicopy cache 62, the port vector FIFO 56, or the host CPU 32; if the management queue 68 is being tested, then data originates from the port vector FIFO 56.

As illustrated in FIG. 5, the queue write side 510 may include a low priority portion 510a and a high priority portion 510b. A switching circuit, such as a multiplexer 518, may be provided to forward the data from the port vector FIFO 56 to either the low priority portion 510a or the high priority portion 510b of the write side queue 510. In such a case, the multiplexer 518 may direct the data to the appropriate portion of the write side queue 510 under the control of a queue state machine 520, which examines certain fields in the data. Alternative logic circuitry may also be provided to receive the data from the port vector FIFO 56 and determine which portion of the write side queue 510 the data should be forwarded.

According to one embodiment of the invention, the write side queue 510 may be provided with only one portion. Consequently, all of the data received from the port vector FIFO 56 would have the same priority. Such an embodiment eliminates the need for the switching circuitry required to forward the data to either the low priority portion 510a or the high priority portion 510b of the write side queue 510.

The write side queue 510 is configured to store a prescribed quantity of data on the switch. Data is transferred from the write side queue 510 to the read side queue 512 along a frame pointer bus 522 by means of the queue overflow engine 514. Once the write side queue 510 is full, the overflow engine 514 transfers data to the external memory 36 in order to allow input of additional data from the port vector FIFO 56. The read side queue 512 also stores a prescribed quantity of data. The queue overflow engine 514 monitors the amount of data currently stored in the read side queue 512, and, if data for that queue is stored in the external memory 36, transfers data into the read side queue 512 along the frame pointer bus 522 until the external memory 36 is cleared or the read side queue 512 is full. During most test operations, however, it is preferred that the storage limitations of the write side queue 510 not be exceeded in order to avoid a situation where data must be written to the external memory 36, and to simplify the test procedure. Accordingly, in these test operations, data input to the queue write side 510 flows directly to the queue read side 512 via the pathway identified along the frame pointer bus 522.

Similar to the queue write side 510, the queue read side 512 may include a low priority portion 512a and a high priority portion 512b. The queue overflow engine 514 examines the data prior to transfer onto the frame pointer bus 522. Data that is determined to be low priority is transferred to the low priority portion 512a of the queue read side 512, while data that is determined to be high priority is transferred to the high priority portion 512b of the queue read side 512. Additionally, the read side queue 512 may be configured to include only one priority portion as previously described.

Data is retrieved from the queue structure 500 via the queue read side 512 along an appropriate bus, such as an output pointer bus 524. The data retrieved from the queue read side 512 is transferred to comparison logic 530 that determines the integrity of the queue structure 500. In order to facilitate this process, the data comparison logic 530 also receives a copy of the original data that is input to the queue write side 510. This may be accomplished in several ways. For example, circuitry may be provided to "snoop" the port vector bus 516 and copy the data (being input to the write side queue 510) to the comparison logic 530. The port vector FIFO 56 may also forward a copy of the data directly to the comparison logic 530. Furthermore, the data may be provided by a test designer in various forms, such as a data file. In such a case, the comparison logic 530 accesses the data directly from the data file. Various other implementations may be used to provide the comparison logic 530 with a copy of the data input to the queue write side 510.

The data retrieved from the output pointer bus 524 may be forwarded to the comparison logic 530 via several paths. As illustrated in FIG. 5, a multiplexer 526, or equivalent switching circuitry, may be provided to receive the data from the output pointer bus 524 and perform the appropriate forwarding function. The data from the output pointer bus 524 may then be forwarded to either a diagnostic register 528 or the dequeuing logic 76. The queue state machine 520 generates the appropriate select signal for controlling multiplexer 526, hence directing data from the output pointer bus 524 to either the diagnostic register 528 or the dequeuing logic 76. In actuality, the data is not retrieved by multiplexer 526. Rather, multiplexer 526 switches the data path for accessing the output pointer bus 524 between the diagnostic register 528 and the dequeuing logic 76. Accessing the output pointer bus 524 via the diagnostic register 528 effectively bypasses the dequeuing logic 76 and allows more precise testing of the queue structure 500.

The select signal may be generated by multiplexer 526 based on various conditions, including input from the designer. For example, if the queue structure 500 is being tested in real time, then actual data is being input to the queue write side 510. Hence, the dequeuing logic 76 (or whatever circuit normally processes input from the queue read side 512) must be used. In such situations, circuitry may be provided to return the data back to queue write side 510 in order to avoid data loss, and, possibly, error recovery routines.

The comparison logic 530 performs a comparison of the data retrieved from the output pointer bus 524 and the data input to the queue write side 510. For example, if ten entries are input to the write side queue 510, then the comparison logic 530 will also receive identical copies of the same ten entries. The entries would then be appropriately indexed and stored in, for example, a temporary buffer. When the comparison logic 530 receives data that corresponds to the first entry from the queue read side 512, it compares it to the first entry in the temporary buffer. If the entries are identical, then the queue structure 500 is determined to be operationally stable, at least with respect to the first entry. If the entries are different, then the circuitry used to implement the queue structure 500 would be diagnosed on a lower level (i.e., a component level) in order to isolate the cause of the discrepancy.

The comparison logic 530 may compare the data in several ways, depending on the specific implementation of the queue structure 500. For example, a bit by bit comparison of the data may be performed. Alternatively, a byte by byte, or word by word comparison could also be performed. Upon completion of the comparison process, the comparison logic 530 may be configured to, for example, output a signal that indicates whether any or all of the data input to the queue structure 500 was corrupted.

In operation, data is input to the queue write side 510 from an external source via an appropriate transfer bus such as the illustrated port vector bus 516. The data may be received from a variety of sources, such as, for example, the port vector FIFO 56. Additionally, depending on the specific implementation of the queue structure 500 the data may be prioritized and forwarded to either a low priority portion 512*a* or a high priority portion 512*b* of the queue write side 512. The data is then forwarded to the queue read side 512 via the queue overflow logic 514 according to the prioritization identified at the queue write side 510, and the status of data stored in the external memory 36 and queue read side 512. Preferably, the data used to test the queue structure 500 is not prioritized and no data is written to the external memory 36. Data is retrieved from the queue read side 512 via an appropriate bus, such as the output pointer bus 524. The data is then forwarded to the comparison logic 530 in order to identify any corruption, i.e., changes between the original data input to the queue write side 510 and the data retrieved from the queue read side 512. Depending on the specific system implementation, the data may be forwarded to the comparison logic 530 by means of the diagnostic register 528 or the dequeuing logic 76. Preferably, the queue structure 500 is placed in a test mode wherein the dequeuing logic 76 is disabled, and data is forwarded to the comparison logic 530 via the diagnostic register 528, thereby allowing precise testing of the queue structure 500. Upon completion of the comparison process, the comparison logic 530 provides an indication as to whether any, or all, of the data input were changed. The indication provided by the comparison logic 530 may, for example, be forwarded to the processor (CPU) interface 50. The host CPU 32 would then initiate output of an appropriate message or indication to an output device such as a printer or display unit (not shown). For example, a text message, indicating whether one or all of the data entries were changed, may be output to the display unit.

The present arrangement simplifies testing of the integrity of queue structures by eliminating the difficulties associated with providing random access to entries in such structures. This is achieved by providing circuitry to input data into an input portion of the queue structure, and retrieve data from an output portion of the queue structure. Since the queue structure is implemented as a FIFO queue, only the currently queued entry need be retrieved at the output portion. The retrieved entry is then compared to the original data input to the input portion of the queue in order to determine if it has been changed by the queue structure. Accordingly, the present arrangement eliminates the need to implement complex circuitry that allows random access to entries at different locations in the queue structure. The circuitry associated with maintaining and indexing the entries for random comparison purposes is also eliminated. Furthermore, the present arrangement eliminates the dangers associated with randomly accessing entries in a FIFO queue. Specifically, the present arrangement eliminates the risk of disrupting the logic used to maintain the queue structure. Additionally the present arrangement eliminates the risk of rendering the queue structure inaccessible.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method of testing the functionality of a queue structure that queues entries, the method comprising the steps:

inputting data into an input portion of the queue structure;

transferring the data into an output portion of the queue structure;

retrieving the data from the output portion of the queue structure; and comparing the retrieved data with the input data to determine the integrity thereof by verifying that the input data has not been altered within the queue structure;

wherein the integrity of the data indicates the functionality of the queue structure.

2. The method of claim 1 further comprising the step of inputting the retrieved data back into the input portion of the queue structure.

3. The method of claim 1, wherein:

the step of inputting data includes the step of inputting data from prescribed fields of a forwarding descriptor onto a port vector index bus of the input portion of the queue; and the step of retrieving data includes the step of retrieving the data from the forwarding descriptor from the output portion of the queue structure.

4. The method of claim 3, wherein the step of comparing includes the steps:

comparing the content of a unicopy field of the input data with the content of a unicopy field of the retrieved data;

comparing the content of a virtual LAN field of the input data with the content of a virtual LAN field of the retrieved data;

comparing the content of an opcode field of the input data with the content of an opcode field of the retrieved data; and comparing the content of a frame pointer field of the input data with the content of a frame pointer field of the of the retrieved data.

5. The method of claim 1, wherein the step of inputting data includes the step of inputting data from prescribed fields of a forwarding descriptor onto a port vector index bus, the data being input from a port vector FIFO that queues forwarding descriptors received from a processor interface and an internal rules checker.

6. The method of claim 1, wherein the step of transferring the data includes the step of transferring the data to an output pointer bus of the output portion of the queue structure.

7. The method of claim 6, wherein the step of retrieving data includes the step of retrieving data from the output pointer bus of the output portion of the queue using a dequeuing logic.

8. The method of claim 7, further comprising the steps:

disabling the dequeuing logic; and enabling a diagnostic register for retrieving data from the output portion of the queue structure.

9. Apparatus for testing the functionality of a queue structure that queues entries, said apparatus comprising:

an input circuit for inputting data into an input portion of the queue structure;

a data transfer circuit for transferring data from said input portion to an output portion of said queue structure;

an output circuit for retrieving data from the output portion of said queue structure; and a comparison logic circuit for comparing the retrieved data with the input data to determine the integrity thereof by verifying that the input data has not been altered by said data transfer circuit;

whereby the integrity of said data indicates the functionality of said queue structure.

10. The apparatus of claim 9, wherein said comparison logic circuit includes circuitry for inputting the retrieved data back into the input portion of said queue structure.

11. The apparatus of claim 9, wherein said output circuit includes:

an output pointer bus for receiving the data from said transfer circuit; and a dequeuing logic for retrieving data from the said output pointer bus and maintaining the ordering of entries retrieved from said queue structure.

12. The apparatus of claim 9, wherein the data input by said input circuit includes data from prescribed fields of a forwarding descriptor, said prescribed fields including:

a unicopy field that indicates whether a data frame will be copied only one port;

a virtual LAN field that stores an identifier for a virtual local area network;

an Opcode field that stores control information for the data frame; and a frame pointer field that points to the location of the data frame in an external memory.

13. The apparatus of claim 12, wherein said comparison logic circuit includes circuitry for respectively comparing the unicopy, virtual LAN, opcode, and frame pointer fields of said input data and said retrieved data.

14. The apparatus of claim 12, wherein said input circuit includes a port vector index bus for receiving said data.

15. The apparatus of claim 14, further comprising a port vector FIFO for queuing forwarding descriptors received from a processor interface and an internal rules checker, and inputting data from said prescribed fields onto said port vector index bus.

16. The apparatus of claim 9, wherein said comparison logic circuit further comprises:

an interrupt circuit for disabling said dequeuing logic while testing data in said queue structure; and a diagnostic register for retrieving data from said output circuit;

whereby retrieved data stored in said diagnostic register may be compared with data input to the queue structure to determine the integrity of said queue structure.

* * * * *